United States Patent
Hong et al.

(10) Patent No.: US 12,444,611 B2
(45) Date of Patent: Oct. 14, 2025

(54) SEMICONDUCTOR PROCESS POLISHING COMPOSITION AND POLISHING METHOD OF SUBSTRATE APPLIED WITH POLISHING COMPOSITION

(71) Applicant: SK enpulse Co., Ltd., Pyeongtaek-si (KR)

(72) Inventors: Seung Chul Hong, Suwon-si (KR); Deok Su Han, Suwon-si (KR); Hwan Chul Kim, Suwon-si (KR); Han Teo Park, Suwon-si (KR); Hyeong Ju Lee, Suwon-si (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 834 days.

(21) Appl. No.: 17/563,499

(22) Filed: Dec. 28, 2021

(65) Prior Publication Data

US 2022/0208552 A1 Jun. 30, 2022

(30) Foreign Application Priority Data

Dec. 29, 2020 (KR) .................. 10-2020-0185626

(51) Int. Cl.
*C11D 3/30* (2006.01)
*C09G 1/00* (2006.01)
*C09G 1/02* (2006.01)
*C09G 1/14* (2006.01)
*C11D 3/37* (2006.01)
*H01L 21/3105* (2006.01)
*H01L 21/768* (2006.01)

(52) U.S. Cl.
CPC .......... *H01L 21/31053* (2013.01); *C09G 1/02* (2013.01); *H01L 21/76819* (2013.01)

(58) Field of Classification Search
CPC .... C11D 3/30; C11D 3/37; C09G 1/00; C09G 1/02; C09G 1/14
See application file for complete search history.

(56) References Cited

U.S. PATENT DOCUMENTS

| 2004/0209555 | A1* | 10/2004 | Sun ............. H01L 21/3212 451/41 |
| 2011/0054162 | A1* | 3/2011 | Kim ............. C07H 21/02 427/127 |
| 2015/0322294 | A1 | 11/2015 | Onishi |
| 2017/0253766 | A1 | 9/2017 | Ho et al. |

FOREIGN PATENT DOCUMENTS

| CN | 1809620 A | 7/2006 |
| CN | 102127370 A | 7/2011 |
| CN | 101802116 B | 3/2014 |
| CN | 102027074 B | 3/2014 |
| CN | 102341463 B | 6/2014 |
| CN | 105802512 A | 7/2016 |
| CN | 108250974 A | 7/2018 |
| CN | 106104763 B | 7/2020 |
| JP | 2006-147993 A | 6/2006 |
| JP | 2006-524918 A | 11/2006 |
| JP | 2012-515806 A | 7/2012 |
| JP | 2014-130944 A | 7/2014 |
| JP | 2017-61612 A | 3/2017 |
| JP | 2019-163420 A | 9/2019 |
| JP | 2019-196467 A | 11/2019 |
| KR | 10-2002-0026940 A | 4/2002 |
| KR | 10-2010-0091292 A | 8/2010 |
| KR | 10-2011-0000578 A | 1/2011 |
| KR | 10-1076625 B | 10/2011 |
| KR | 10-1243331 B1 | 3/2013 |
| KR | 10-1245545 B | 3/2013 |
| KR | 10-2015-0102990 A | 9/2015 |
| KR | 1020160073035 | * 6/2016 ............... C09K 3/14 |
| KR | 10-2017-0118690 A | 10/2017 |
| KR | 10-2019-0060226 A | 6/2019 |
| KR | 10-2019-0105770 A | 9/2019 |
| TW | 201430115 A | 8/2014 |
| TW | 201712098 A | 4/2017 |

* cited by examiner

*Primary Examiner* — Brian P Mruk
(74) *Attorney, Agent, or Firm* — NSIP Law

(57) ABSTRACT

A semiconductor process polishing composition, and a polishing method of a substrate applied with a polishing composition are provided. The process provides a polishing composition improved in the polishing rate, selectivity and dispersibility, and provides a manufacturing method of a substrate that is polished by applying such a polishing composition for a semiconductor process.

13 Claims, No Drawings

SEMICONDUCTOR PROCESS POLISHING COMPOSITION AND POLISHING METHOD OF SUBSTRATE APPLIED WITH POLISHING COMPOSITION

CROSS-REFERENCE TO RELATED APPLICATIONS

This application claims the benefit under 35 U.S.C. 119(a) of Korean Patent Application No. 10-2020-0185626, filed on Dec. 29, 2020 in the Korean Intellectual Property Office, the entire disclosure of which is incorporated herein by reference for all purposes.

BACKGROUND

1. Field

The following description relates to a polishing composition for a semiconductor process, and a polishing method of a substrate applied with the polishing composition.

2. Description of Related Art

Semiconductor devices are being implemented with a smaller for factor, and are becoming more highly integrated. Accordingly, technology to form a finer pattern is being implemented. In this regard, a surface structure of a semiconductor device has become more complicated, and problems that occur due to a height difference between layers may occur more often. In manufacturing semiconductor devices, a Chemical Mechanical Polishing (CMP) process may be used as a flattening technology to remove the height difference that may occur in specific layers formed on a substrate.

The CMP process may allow the surface to be polished while slurry is supplied to a polishing pad, and a substrate is pressurized and rotated. A target to be flattened may vary depending on the stage of a process, and the properties of slurry applied during this time may also have a difference depending on the processing stage.

Polishing after a metal wiring is formed may need a sufficient polishing rate and a sufficient polishing speed to be maintained while dishing, erosion and the like are minimized.

SUMMARY

In one This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor process polishing composition includes metal oxide particles which have a surface that exposes functional groups as polishing particles, wherein the surface comprises a first functional group comprising an epoxy group in an end, and a second functional group comprising an amine group in the end, and wherein an amount of the second functional group is greater than an amount of the first functional group.

The metal oxide particles may be modified with a silane compound which has the first functional group in the end and a silane compound which has the second functional group in the end.

The first functional group and the second functional group may have a ratio of 1:1 to 15 as a mole ratio.

The metal oxide particles may be any one selected from the group colloidal silica, fumed silica, ceria, alumina, titania, zirconia and combinations thereof.

The metal oxide particles may have a diameter ($D_{50}$) of 10 nm to 120 nm.

The semiconductor process polishing composition may further include a non-ionic polymer and a chelator.

The polishing composition may have a pH of 2 to 5.

The polishing composition may have a silicon oxide polishing index of 250 [Å/(min·wt %)] or more expressed by the following Equation:

$$\text{Silicon oxide polishing index} = \frac{\text{Polishing rate of a Silicon oxide(Å/min)}}{\substack{\text{Concentration of the metal oxide particles in the} \\ \text{polishing composition for a semiconductor process(wt \%)}}}$$

A polishing rate of a silicon oxide based on a polishing rate of tungsten, may be 25 or more.

A time taken for a size of the polishing particles to increase by 10% or more based on $D_{50}$, may be 12 months or more.

The process may further include simultaneously polishing tungsten, a diffusion preventing film and a silicon oxide.

In a general aspect, a substrate manufacturing method may include polishing a substrate by applying the semiconductor process polishing composition as a slurry.

In a general aspect, a semiconductor device manufacturing method includes forming an insulating film on a substrate; polishing a portion of the insulating film based on a predesigned wiring shape; forming a tungsten metal film on the polished insulating film to manufacture a substrate before being polished; and polishing the substrate before being polished, wherein the polishing operation comprises polishing the substrate before being polished by applying the semiconductor process polishing composition as slurry.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

In the one or more examples, "B being placed on A" means that B is placed in direct contact with A or placed over A with another layer or structure interposed therebetween and thus should not be interpreted as being limited to B being placed in direct contact with A.

In the one or more examples, the phrase "combination(s) thereof" included in a Markush-type expression denotes one or more mixtures or combinations selected from the group consisting of components stated in the Markush-type expression, that is, denotes one or more components selected from the group consisting of the components are included.

In the one or more examples, the description of "A and/or B" means "A, B, or A and B."

In the one or more examples, terms such as "first", "second", "A", or "B" are used to distinguish the same terms from each other unless specially stated otherwise.

In the one or more examples, a singular form is contextually interpreted as including a plural form as well as a singular form unless specially stated otherwise.

The example polishing method of a substrate applied with a polishing composition enables polishing excellent in selectivity, and may have improved dispersibility for securing dispersion stability, a polishing composition, a substrate polished by the polishing method of a substrate and the like.

Hereinafter, the one or more examples will be described in further detail.

One or more examples provide a polishing composition for a semiconductor process comprising metal oxide particles having a surface where functional groups are exposed as polishing particles, wherein the surface comprises a first functional group comprising an epoxy group in the end and a second functional group comprising an amine group in the end, wherein an amount of the second functional group is greater than an amount of the first functional group.

The metal oxide particles may be metal oxide particles applied in the field of polishing composition for a semiconductor process. The metal oxide particles may be, for example, any one selected from the group consisting of colloidal silica, fumed silica, ceria, alumina, titania, zirconia and combinations thereof. Specifically, as the metal oxide particles, colloidal silica, fumed silica, ceria or a mixture thereof may be applied.

The metal oxide particles have a surface where functional groups are exposed. In an example, the surface of colloidal silica having a nanoscale size may be modified to have an amine group or the like, to improve a polishing rate with respect to a silicon oxide. However, this may lead to change of surface zeta potential of the metal oxide particles, and this change of a zeta potential value may have an adverse affect with regard to the long-term storability of a polishing composition for a semiconductor process. To solve this problem, example embodiments may apply a functional group modifying the surface to have positive electric charges and a functional group modifying the surface to have a non-ionic functional group at the same time.

In an example, the metal oxide particles may have a modified surface.

The surface may include a first functional group comprising an epoxy group in the end and a second functional group comprising an amine group in the end.

In the surface, the amount of the second functional group may be greater than the amount of the first functional group. Metal oxide particles having such a surface may have proper repulsive power with respect to a polishing pad when applied as polishing particles. Additionally, the occurrence of defects such as a scratch generated by polishing particles when a substrate is polished may be further decreased.

The ratio of the first functional group and the second functional group may be a mole ratio of 1:1 to 15. The ratio of the first functional group and the second functional group may be a mole ratio of 1:1 to 12. The ratio of the first functional group and the second functional group may be a mole ratio of 1:1 to 8. The ratio of the first functional group and the second functional group may be a mole ratio of 1:1 to 6. The ratio of the first functional group and the second functional group may be a mole ratio of 1:1.2 to 3.8. When the first functional group and the second functional group are applied in such a ratio, it is possible to improve storage stability of a polishing composition furtherly in addition to decreasing of the possibility of the occurrence of defects during polishing at the same time.

In an example, a silane compound having the functional group in one end is applied to the metal oxide particles and thereby the functional group may be introduced to the surface of the metal oxide.

The silane compound having a first functional group may be for example, amino silane, ureido silane or a combination thereof, and specifically, may be amino silane.

The amino silane may be for example, any one selected from the group of 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopropyltrimethoxysilane, N-[3-(trimethoxysilyl)propyl]butylamine and combinations thereof.

The ureido silane may be any one selected from the group consisting of 3-ureidotrimethoxysilane, 3-ureidotriethoxysilane and combinations thereof.

The silane compound having the second functional group may be epoxy silane.

The epoxy silane may be, for example, any one selected from the group of 3-glycidoxypropyltrimethoxysilane, 3-glycidoxypropyltriethoxysilane, 3-(2,3-epoxypropoxypropyl)methyldimethoxysilane, 3-(2,3-epoxypropoxypropyl) methyldimethoxysilane, 3-(2,3-epoxypropoxypropyl)methyldiethoxysilane, 2-(3,4-epoxycyclohexyl) ethyltrimethoxysilane and combinations thereof.

The silane compound may be applied in an amount of 1 to 10 parts by weight based on the metal oxide particles in an amount of 100 parts by weight. The silane compound may be applied in an amount of 3 to 8 parts by weight based on the metal oxide particles in an amount of 100 parts by weight. In such an example, modification of the surface of metal oxide particles may sufficiently proceed, a film layer may not be formed on the surface of the metal oxide particles, and thereby the polishing speed of polishing particles can be maintained in a desired level.

The amount of the silane compound may be the sum value of the amount of a silane compound having a first functional group and the amount of a silane compound having a second functional group.

In an example, the metal oxide particles may have a diameter ($D_{50}$) of 10 nm to 120 nm. In an example, the metal oxide particles may have a diameter ($D_{50}$) of 20 nm to 100 nm. The metal oxide particles may have a diameter ($D_{50}$) of 20 nm to 60 nm. When the metal oxide particles have a diameter of more than 120 mm, the possibility of generating defects such as a scratch to a surface of a polishing target substrate or the like may be increased. When the diameter of the metal oxide particles is less than 20 nm, dispersibility of particles may be degraded. When the diameter of the metal oxide particles is 20 nm to 60 nm, excellent properties may be obtained if applied as polishing slurry of a substrate having a fine wiring width.

In an example, the above-described diameter may be measured with a Nano-ZS device available from MALVERN to measure the size of particles through DLS (Dynamic Light Scattering) method.

The polishing particles may be implemented in an amount of 0.5 wt % to 8 wt % based on a total polishing composition for a semiconductor process. The polishing particles may be implemented in an amount of 0.5 wt % to 5 wt % based on a total polishing composition for a semiconductor process. The polishing particles may be implemented in an amount of 2 wt % to 4 wt % based on a total polishing composition for a semiconductor process. When the polishing composition for a semiconductor process comprises polishing particles in such an amount range, it is possible to obtain dispersion stability and the effect of decreasing defects on the surface of a polished substrate at the same time. The polishing composition for a semiconductor process may further comprise non-ionic polymer.

The non-ionic polymer may improve the dispersibility of polishing particles. Specifically, the polymer which is non-ionic can increase dispersibility by being absorbed to the polishing particles, and the non-ionic polymer which is not absorbed can further increase dispersion stability due to steric hindrance effect or the like. Additionally, the polymer may allow the polishing composition for a semiconductor process to have a more stable dispersion stability due to non-ionicity even in an acidic environment as described below. Additionally, the polymer may decrease the occurrence of defects resulting from polishing on the substrate during a polishing process.

The non-ionic polymer may be at least any one selected from the group polyethylene glycol, polypropylene glycol, polyvinyl pyrrolidone, polyethylene oxide, polypropylene oxide, polyalkyl oxide, polyoxyethylene oxide, polyethylene oxide-propylene oxide copolymer, cellulose, methylcellulose, methylhydroxyethylcellulose, methylhydroxypropylcellulose, hydroxyethylcellulose, carboxymethylcellulose, carboxymethylhydroxyethylcellulose, sulfoethylcellulose and carboxymethylsulfoethylcellulose.

The non-ionic polymer may be one having a weight average molecular weight of less than 25,000 g/mol. When the non-ionic polymer has a weight average molecular weight of less than 25,000 g/mol, the non-ionic polymer may have excellent solubility and dispersibility. The non-ionic polymer may be a polymer having a weight average molecular weight of 1,000 g/mol or more and less than 25,000 g/mol. When applying a non-ionic polymer in such a range, a polishing composition for a semiconductor process may have more excellent solubility and dispersion stability, and may be advantageous in polishing characteristics.

The non-ionic polymer may be comprised in an amount of 0.01 wt % to 5 wt % based on a total polishing composition for a semiconductor process. The non-ionic polymer may be comprised in an amount of 0.1 wt % to 2 wt % based on a total polishing composition for a semiconductor process. In such an example, the occurrence of defects of the surface of a polished substrate may be decreased, and particles may be effectively prevented from being adhered again to the surface of the polished substrate after polishing.

A chelator may enable removal of metals or metal ions to be easily made by absorbing metals or metal ions. Specifically, metals generated in a polishing process may cause defects with a high possibility due to being reattached to the polished surface and remaining even in subsequent processes. Particularly, a metal such as tungsten may be dissolved relatively easily in a certain environment, but has a characteristic which is easily reattached to a surface of the polished substrate, and therefore, a chelator may be applied for a role of sequestrant in order to prevent this.

In an example, the chelator may be at least one selected from the group butyric acid, citric acid, tartaric acid, succinic acid, oxalic acid, acetic acid, adipic acid, capric acid, caproic acid, caprylic acid, carboxylic acid, glutaric acid, glutamic acid, glycolic acid, thioglycolic acid, formic acid, mandelic acid, fumaric acid, lactic acid, lauric acid, malic acid, maleic acid, malonic acid, myristic acid, palmitic acid, phthalic acid, isophthalic acid, terephthalic acid, citraconic acid, propionic acid, pyruvic acid, stearic acid, valeric acid, benzoic acid, phenylacetic acid, naphthoic acid, aspartic acid, amino acid and ethylenediaminetetraacetic acid. The amino acid may be glycine, α-alanine, β-alanine, L-aspartic acid, N-methylglycine (methylglycine) or a combination thereof.

The chelator may be one comprising two or more carboxyl group or alcohol group. Two or more types of chelators comprising two or more carboxyl groups or alcohol groups may be applied. Specifically, the chelator may comprise any one selected from the group of EDTA (ethylenediaminetetraacetic acid), glycine, carboxyl acids and combinations thereof. The carboxyl acids refer to compounds comprising at least one, two or more carboxyl groups.

The chelator may be implemented in an amount of 0.003 wt % to 0.5 wt % based on the total polishing composition for a semiconductor process. The chelator may be implemented in an amount of 0.005 wt % to 0.3 wt %. When the chelator is implemented in an amount of less than 0.003 wt %, the polishing rate may be decreased, or a possibility of generating surface defects such as dishing may be increased. When the chelator is implemented in an amount of more than 0.5 wt %, a possibility of causing excessive polishing may be increased.

The polishing composition for a semiconductor process may further comprise an oxidant.

The oxidant may allow a metal such as tungsten to be oxidized, thereby preparing an environment for easier flattening, and may serve as a role of improving a polishing speed and an etching speed.

The oxidant may be at least any one selected from the group hydrogen peroxide, urea hydrogen peroxide, urea, percarbonate salt, periodate acid, periodate salt, perchloric acid, perchlorate salt, perbromic acid, perbromate salt, perborate acid, perborate salt, permanganic acid, permanganate salt, persulfate salt, bromate salt, chlorate salt, chlorite salt, chromate salt, iodate salt, iodic acid, ammonium peroxide, benzoyl peroxide, calcium peroxide, barium peroxide, sodium peroxide and urea peroxide.

The oxidant may be implemented in an amount of 0.01 wt % to 5 wt % based on a total polishing composition for a semiconductor process. When the amount of the oxidant is less than 0.01 wt %, the polishing speed may be too slow or the polishing of a metal portion such as tungsten may not be sufficient. When the amount of an oxidant is more than 5 wt % or more, an oxide film may be grown on the metal portion, and due to this, the quality such as flatness of a polished surface may be degraded.

In an example, the polishing composition for a semiconductor process may be an acid solution. Specifically, the polishing composition for a semiconductor process may have a pH of 2 to 5. The polishing composition for a semiconductor process may have a pH of 3 to 4.5. When the pH of the polishing composition for a semiconductor process is controlled in such a range, the polishing speed and the polishing quality may be maintained to be a certain level or more, while preventing metal portions or a polishing device from being excessively corroded.

To manufacture a polishing composition for a semiconductor process as an acid solution, an acid ingredient may be added to the composition in addition to a solvent. The acid ingredient may be applied to a polishing composition for a semiconductor process in addition to a pH regulator.

The acid ingredient may be, for example, any one selected from the group hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, salicylic acid, pimelic acid, benzoic acid, succinic acid, phthalic acid, butyric acid, glutaric acid, glutamic acid, glycolic acid, lactic acid, aspartic acid, tartaric acid and salts thereof.

The pH regulator may be any one selected from the group ammonia, aminomethylpropanol, tetramethylammonium hydroxide, potassium hydroxide, sodium hydroxide, magnesium hydroxide, rubidium hydroxide, cesium hydroxide, sodium hydrogen carbonate, sodium carbonate, imidazole and combinations thereof.

The acid ingredient and pH regulator may be applied in a predetermined amount to be set to a desired pH.

A polishing composition for a semiconductor process comprises a solvent in addition to respective ingredients described in the above description, and additive respective ingredients described below. The solvent may be water, and preferably may be ultra-pure water.

The polishing composition for a semiconductor process may have excellent storage stability with excellent polishing characteristics, when comprising characteristic ingredients described in the above.

Specifically, a time taken for a size of the polishing particles to increase by 10% or more based on $D_{50}$ of the polishing particles may be after 12 months or more. Such an effect may correspond to an effect of about two times or more when compared to particles that are not specifically modified for the surface in the examples. The polishing particles having such an effect may have more improved dispersion stability, and may have the particles dispersed well even after being stored for a long time, thereby enabling easier long-term storage.

Additionally, in an example of some polishing composition for a semiconductor process, an acid ingredient may be blended to the polishing composition just before being used to improve particle dispersion stability. The polishing composition for a semiconductor process in one or more examples also has comparatively excellent particle dispersion stability in a state of comprising all acidic ingredients, and this is a characteristic which can further increase usability.

The polishing composition for a semiconductor process may polish tungsten, a diffusion preventing film and a silicon oxide at the same time.

It is beneficial to obtain respectively suitable characteristics depending on respective stages of manufacturing a semiconductor that are complicated and diversified.

The wiring width of a semiconductor element may be being gradually narrowed, and the example of a fine wiring width of 7 μm to 10 μm when applying a metal such as tungsten is beneficial. A wiring may be formed by implementing a process of forming a polished portion depending on a predesigned wiring shape to an insulating layer, forming a tungsten wiring layer to the polished portion, and subsequently flattening. In this time, the polishing comprises a first polishing process of removing a bulk tungsten, and a second polishing process of polishing an insulating layer and a tungsten wiring layer together.

In an example of tungsten, there may be a great difference in the polishing characteristics between a metal tungsten and a tungsten oxide. Accordingly, when a polishing composition with strong chemical polishing characteristics is applied to the first polishing process, it may be difficult to apply the same polishing composition as the first polishing process to the second polishing process. This is because when a flattening work is performed in a surface where an insulating layer and a tungsten wiring layer are simultaneously exposed, a possibility of generating defects increases due to the difference in the polished degree thereof.

A barrier layer (diffusion preventing layer) may be disposed between an insulating layer such as, but not limited to, $SiO_2$ and a tungsten wiring layer to improve an adhesion property or the like. In an example, the barrier layer may comprise titanium or titanium nitride.

When a barrier layer is applied to the substrate, the second polishing process may polish all the insulating layer, barrier layer and wiring layer exposed in one surface. The material of each layer may differ in strength and the polished degree with respect to a polishing solution. Therefore, it may not be easy to polish the layers without the occurrence of defects such as dishing while maintaining a polishing speed in a certain level or more.

The polishing composition for a semiconductor process may have selectivity of 25 or more, which means a polishing rate of a silicon oxide based on the polishing rate of tungsten. This means the polishing rate of a silicon oxide may be 25 times greater compared to the polishing rate of tungsten. The selectivity may be 30 or more. The selectivity may be 50 or less. The selectivity may be 45 or less. The selectivity may be 40 or less. When the selectivity is in such a range, it may be possible to polish properly the surface of a polishing target without the occurrence of defects such as dishing in the second polishing process.

The polishing composition for a semiconductor process may also have a characteristic of a silicon oxide polishing index in a certain level or more, which shows the polishing rate of a silicon oxide per unit weight of polishing particles contained in the composition.

The silicon oxide polishing index is expressed by below Equation 1 below.

$$\text{Silicon oxide polishing index} = \frac{\text{Polishing rate of a Silicon oxide}(\text{Å}/\min)}{\text{Concentration of the metal oxide particles in the polishing composition for a semiconductor process}(\text{wt \%})} \quad \text{Equation 1}$$

Silicon oxide polishing index is measured under the condition of a pressure of 2.2 psi, a carrier speed of 103 rpm, a platen speed of 57 rpm, and a slurry flow rate of 300 ml/min.

The polishing composition for a semiconductor process may have the silicon oxide polishing index of 250 [Å/(min·wt %)] or more. The polishing index may be 300 [Å/(min·wt %)] or more. The polishing index may be 500 [Å/(min·wt %)] or less. The polishing index may be 450 [Å/(min·wt %)] or less. The polishing index may be 400 [Å/(min·wt %)] or less. When the polishing composition having such a characteristic is applied to polish a silicon oxide film, it is possible to improve polishing efficiency and reduce the occurrence of polishing defects.

The polishing composition for a semiconductor process also has a characteristic of a tungsten polishing index in a certain level or more, which shows the polishing rate of tungsten per unit weight of polishing particles contained in the composition.

The tungsten polishing index is expressed by below Equation 2 below.

$$\text{Tungsten polishing index} = \frac{\text{Polishing rate of a Tungsten}(\text{Å}/\min)}{\text{Concentration of the metal oxide particles in the polishing composition for a semiconductor process}(\text{wt \%})} \quad \text{Equation 2}$$

Tungsten polishing index is measured under the condition of a pressure of 2.2 psi, a carrier speed of 103 rpm, a platen speed of 57 rpm, and a slurry flow rate of 300 ml/min.

The polishing composition for a semiconductor process may have the tungsten polishing index of 8 [Å/(min·wt %)] or more. The tungsten polishing index may be 10 [Å/(min·wt %)] or more. The tungsten polishing index of 15 [Å/(min·wt %)] or less. The tungsten polishing index may be 12 [Å/(min·wt %)] or less. When the polishing composition having such a characteristic is applied to polish a tungsten metal film, it is possible to improve polishing efficiency and reduce the occurrence of polishing defects.

A manufacturing method of a polished substrate, in accordance with one or more embodiments comprises a process of polishing a substrate by applying the polishing composition for a semiconductor process described in the above as a slurry.

The substrate may be a semiconductor substrate. Specifically, the substrate may be one in which an insulting film is formed on a flattened semiconductor substrate, some of the insulating film is polished depending on a predesigned wiring shape, and subsequently a tungsten metal film is formed on a polished portion. A diffusion preventing layer may be formed between the insulating film and the tungsten metal film as needed.

The materials applied to the insulating film, the tungsten metal film, the diffusion preventing layer and the like may be applied without limitation if the materials are ordinary applicable materials.

A process of polishing a substrate may proceed as at least two stages.

The process of polishing a substrate may proceed substantially, as a first polishing process of flattening a surface where a tungsten metal film is exposed (shorten to a bulk tungsten layer), and a second polishing process of flattening a surface where an insulating layer, a tungsten metal film and the like are exposed of the substrate after the first polishing process.

The polishing composition for a semiconductor process described above may be applied in the second polishing process.

A detailed description of the polishing composition for a semiconductor process is the same as the description described above, and thus the description thereof will be omitted.

A polished substrate manufactured in this manner may have a polished surface in which defects are further decreased.

Hereinafter, while the one or more examples will be described in more detail with reference to the accompanying examples, it is noted that the examples are not limited to the same.

1. Manufacture of Polishing Composition

Metal oxide particles that are modified for the surface from colloidal silica particles having a diameter $D_{50}$ of 40 μm may be manufactured as polishing particles. The metal oxide particles may be manufactured by applying a silane compound comprising 3-aminopropylethoxysilane which is an amine-based silane and 3-glycidoxypropyltriethoxysilane which is an epoxy-based silane to have the sum of 5 parts by weight based on the colloidal silica particles of 100 parts by weight, and modifying the surface of the colloidal silica particles with the silane compound. The applying ratios (based on mole) of respective silane compounds are based on the amounts present in Table 1 below.

Ultra-pure water was applied as a solvent, the polishing particles of 3 wt % and glycine as a chelator of 0.1 wt % were applied, a fluorine-based surfactant (weight average molecular weight of 350 g/mol) as a dispersant of 50 ppm (based on weight) was applied, and acetic acid was further added to manufacture a polishing composition with pH 4.

(2) Evaluation of Defects

After polishing under the same condition with the Polishing evaluation, a cleaning process was performed under the condition of a rotating speed of a brush applied to be 500 rpm, and injection for 60 seconds of a cleaning chemical solution prepared by self-manufacture in a flow rate of 2000 cc/min. A tungsten and a silicon oxide wafer after the cleaning process were measured for a total defect number in a state of being placed in a sealed wafer foup by using AIT-XP+ device kept by SKC Corporation. A blanket tungsten wafer and a blanket silicon wafer were respectively circle type wafers with a diameter of 300 mm, and the surface of the wafer was evaluated by laser source of 3.5 μm

TABLE 1

| Items | Input Ratio of Epoxy Silane (Based on Mole) | Input Ratio of Amino Silane (Based on Mole) | Ratio of Surface Modifier | pH | Size (nm) | Concentration of Polishing Particles (wt %) |
|---|---|---|---|---|---|---|
| Example 1 | 1 | 4 | 4.00 | 4 | 40 | 3 |
| Example 2 | 2 | 3 | 1.50 | 4 | 40 | 3 |
| Comparative Example 1 | 3 | 2 | 0.67 | 4 | 40 | 3 |
| Comparative Example 2 | 4 | 1 | 0.25 | 4 | 40 | 3 |
| Comparative Example 3 | 0 | 5 | Infinity | 4 | 40 | 3 |
| Comparative Example 4 | 5 | 0 | 0.00 | 4 | 40 | 3 |

2. Property Evaluation of Polishing Composition (1) Polishing Evaluation

A polishing evaluation on a tungsten wafer with a thickness of about 5,000 Å and a silicon oxide with a thickness of about 20,000 Å was performed. Specifically, the polishing was performed for 60 seconds under the condition of a pressure of 2.2 psi, a carrier speed of 103 rpm, a platen speed of 57 rpm, and a slurry flow rate of 300 ml/min.

The thickness of each wafer after the polishing process was measured, and the polishing rate (polishing speed; Å/min) of the Examples and Comparative Examples with respect to a tungsten film and a silicon oxide was respectively calculated from the above. The result is the same as Table 1 above.

(3) Evaluation of Storage Stability (Life Time)

Respective polishing compositions were kept at 45° C. The diameter of polishing particles before being kept was measured, the diameter was measured again with an interval of 1 month, and a point in time when the diameter was increased by 5% or more was shown in Table 2 below.

TABLE 2

|  | Polishing Rate of Tungsten (Å/min) | Polishing Index* of Tungsten | Polishing Rate of Silicon Oxide (Å/min) | Polishing Index* of Silicon Oxide | Ratio (Selectivity) | Defects of Blanket Tungsten Wafer (ea) | Defects of Blanket Silicon Oxide (ea) | Storage Stability (Life Time) |
|---|---|---|---|---|---|---|---|---|
| Example 1 | 35 | 11.67 | 1101 | 367.00 | 31.46 | 12 | 88 | 12 Months or More |
| Example 2 | 32 | 10.67 | 1012 | 337.33 | 31.63 | 8 | 75 | 12 Months or More |
| Comparative Example 1 | 32 | 10.67 | 578 | 192.67 | 18.06 | 22 | 66 | 12 Months or More |
| Comparative Example 2 | 34 | 11.33 | 493 | 164.33 | 14.50 | 19 | 57 | 12 Months or More |
| Comparative Example 3 | 33 | 11.00 | 1320 | 440.00 | 40.00 | 23 | 320 | 6 Months |
| Comparative Example 4 | 31 | 10.33 | 342 | 114.00 | 11.03 | 31 | 31 | 12 Months or More |

*Polishing Index is a value evaluated by Equation 1 and Equation 2.

Referring to Table 1 and Table 2 above, Examples having the surface characteristics of the one or more embodiments showed a result of a proper level or more in both polishing rate of tungsten and polishing rate of a silicon oxide, and defects thereof were also shown as relatively low. In an example of Comparative Example 3, the polishing speed was excellent overall, but defects of a silicon oxide were excessively shown, and in the examples of Comparative Examples 1, 2, and 4, a shortcoming in the polishing speed was identified. In the example of Comparative Example 3, a result of storage stability which is degraded to be half or more was shown when compared to other Examples and Comparative Examples.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A polishing composition for a semiconductor process, the polishing composition comprising:
    metal oxide particles which have a surface that exposes functional groups as polishing particles,
    wherein the surface comprises a first functional group comprising an epoxy group at an end and a second functional group comprising an amine group at an end, and
    wherein the first functional group and the second functional group are present in a mole ratio of 1:1.2 to 1:15 (first:second).

2. The polishing composition of claim 1, wherein the metal oxide particles are modified with a first silane compound which has the first functional group in the end and a second silane compound which has the second functional group in the end,
    wherein the first silane compound having the first functional group is amino silane, and
    wherein the second silane compound having the second functional group is epoxy silane.

3. The polishing composition of claim 1,
    wherein the first functional group and the second functional group have a mole ratio of 1:1.2 to 1:8 (first: second).

4. The polishing composition of claim 1, wherein the metal oxide particles are any one selected from the group consisting of colloidal silica, fumed silica, ceria, alumina, titania, zirconia and combinations thereof.

5. The polishing composition of claim 1, wherein the metal oxide particles have a diameter ($D_{50}$) of 10 nm to 120 nm.

6. The polishing composition of claim 1, wherein the polishing composition further comprises a non-ionic polymer and a chelator.

7. The polishing composition of claim 6, wherein the polishing composition has a pH of 2 to 5.

8. The polishing composition of claim 1, wherein the metal oxide particles have a diameter ($D_{50}$) of 20 nm to 60 nm.

9. The polishing composition of claim 1,
    wherein the polishing particles are implemented in an amount of 0.5 wt % to 8 wt % based on a total polishing composition.

10. The polishing composition of claim 6,
    wherein the non-ionic polymer is comprised in an amount of 0.1 wt % to 2 wt % based on a total polishing composition.

11. The polishing composition of claim 6,
    wherein the chelator is implemented in an amount of 0.005 wt % to 0.3 wt % based on a total polishing composition.

12. A substrate manufacturing method, comprising:
    polishing a substrate by applying the semiconductor process polishing composition according to claim 1 as a slurry.

13. A semiconductor device manufacturing method, comprising:
    forming an insulating film on a substrate;
    polishing a portion of the insulating film based on a predesigned wiring shape;
    forming a tungsten metal film on the polished insulating film to manufacture a substrate before being polished; and
    polishing the substrate before being polished,
    wherein the polishing operation comprises polishing the substrate before being polished by applying the semiconductor process polishing composition according to claim 1 as slurry.

* * * * *